(12) United States Patent
Chuang et al.

(10) Patent No.: US 7,973,564 B1
(45) Date of Patent: Jul. 5, 2011

(54) HIGH LOAD DRIVING DEVICE

(75) Inventors: Ching-Te Chuang, Taipei County (TW);
Chien-Yu Lu, Taichung (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 12/874,584

(22) Filed: Sep. 2, 2010

(30) Foreign Application Priority Data

Jun. 22, 2010 (TW) ................................ 99120224 A

(51) Int. Cl.
*H03K 19/094* (2006.01)
(52) U.S. Cl. .............. 326/87; 326/86; 326/88; 327/109; 327/112; 327/390; 327/589
(58) Field of Classification Search .............. 326/82–83, 326/86–88; 327/108–109, 111–112, 390, 327/589
See application file for complete search history.

(56) References Cited

U.S. PATENT DOCUMENTS

| | | | |
|---|---|---|---|
| 5,391,939 A * | 2/1995 | Nonaka | 326/83 |
| 5,471,150 A * | 11/1995 | Jung et al. | 326/87 |
| 5,729,165 A | 3/1998 | Lou et al. | |
| 6,242,973 B1 * | 6/2001 | Kong et al. | 327/589 |
| 6,404,237 B1 * | 6/2002 | Mathew et al. | 326/113 |
| 6,606,271 B2 * | 8/2003 | Hunt | 365/189.05 |
| 2010/0244907 A1 * | 9/2010 | Gagne et al. | 327/109 |

OTHER PUBLICATIONS

2010 International Symposium on VLSI Technology, Systems and Applications and VLSI Design, Automation and Test, Apr. 26-29, 2010, pp. 1-108, Hsinchu, Taiwan.
Lu, Chien-Yu and Chuang, Ching-Te, "Energy Efficient Bootstrapped CMOS Large RC-Load Driver Circuit for Ultra Low-Voltage VLSI," 2010 International Symposium on VLSI Design, Automation and test, Session W2-W22. Apr. 28, 2010, p. 59.
Lou, J.H. and Kuo, J.B., "A 1.5- V full-swing bootstrapped CMOS large capacitive-load driver circuit suitable for low-voltage CMOS VLSI," IEEE Journal of Solid-State Circuits, Jan. 1997, pp. 119-121, vol. 32.

* cited by examiner

*Primary Examiner* — Jason M Crawford
(74) *Attorney, Agent, or Firm* — Muncy, Geissler, Olds & Lowe, PLLC

(57) ABSTRACT

A high load driving device is disclosed. The driving device comprises an inverter receiving a digital voltage. The inverter reverses the digital voltage, and then sends out it. The output terminal of the inverter is coupled to a capacitor, a first P-type field-effect transistor (FET), a second P-type FET, a first N-type FET, and a third N-type FET. A push-up circuit is composed of these transistors and a second N-type FET and coupled to a P-type push-up FET. A load is coupled to a high voltage through the P-type push-up FET. When the digital voltage rises from a low level to a high level, the push-up circuit utilizes the original voltage drop of the capacitor to control the P-type push-up FET, whereby the gate voltage of the P-type push-up FET is at a low stabilization voltage that is lower than the ground potential. Then, the load is driven rapidly.

9 Claims, 6 Drawing Sheets

HIGH LOAD DRIVING DEVICE

BACKGROUND OF THE INVENTION

1. Field of the Invention

The present invention relates to a driving device, particularly to a high load driving device.

2. Description of the Related Art

Refer to FIG. 1 for a conventional high load driving circuit, which comprises an inverter 10, two capacitors 12, 14, four P-type field-effect transistors (FET) 16, 18, 20, 22, and four N-type field-effect transistors 24, 26, 28, 30. When the input voltage Vi is equal to a ground potential, the voltage Va output by the inverter 10 is Vdd. The drain voltage V2p of the third N-type FET 28 is fixedly set to the ground potential by the turned-on third N-type FET 28. Thus, the first capacitor 12 has a given voltage and stores a given quantity of charges. Meanwhile, Va is coupling the second capacitor 14 to push up the drain voltage V2n of the second P-type FET 18 to be greater than Vdd. Then, the turned-on third P-type FET 20 makes the gate voltage V1n of the fourth N-type FET 30 greater than Vdd. Consequently, the fourth N-type FET 30 has increased capability of driving the current of a load 32. When the input Vi is equal to Vdd, the voltage Va output by the inverter 10 is equal to the ground potential. The drain voltage V2n of the second P-type FET 18 is fixedly set to Vdd by the turned-on second P-type FET 18. Thus, the second capacitor 14 has a given voltage and stores a given quantity of charges. Meanwhile, Va is coupling the first capacitor 12 to pull down the drain voltage V2p of the third N-type FET 28 to be lower than the ground potential. Then, the turned-on second N-type FET 26 makes the gate voltage V1p of the fourth P-type FET 22 smaller than the ground potential. Consequently, the fourth P-type FET 22 has increased capability of driving the current of a load 32. Thereby, the two capacitors can alternately stores charges and respectively push up and pull down V2n and V2p to the required high-level voltage and low-level voltage according to the input voltage Vi. Thus, the conventional high load driving circuit can provide higher current than the original driving transistors.

In the abovementioned prior art, the coupled capacitors perform step-up and step-down to attain the required over-Vdd high-level voltage and under-ground potential low-level voltage. However, current is likely to leak out from the turned-on second P-type FET 18 and the turned-on third N-type FET 28. Thus, the voltage level is decreased. When the input voltage Vi is equal to a ground potential, Va is coupling the second capacitor 14 to push up the drain voltage V2n of the second P-type FET 18 to be greater than Vdd, and the turned-on third P-type FET 20 makes the fourth N-type FET 30 have a gate voltage V1n greater than Vdd and have an increased capability of driving the current of the load 32. However, V2n, which is over Vdd, creates a positive bias on the second P-type FET 18 with respect to the Va node, which is at Vdd. Thus is formed a current-leakage path toward the power source Vdd. The current leakage decreases the level of the over-Vdd voltage of V1n and V2n. When Vi is equal to Vdd, Va is equal to the ground potential. Meanwhile, Va is coupling the first capacitor 12 to pull down the drain voltage V2p of the third N-type FET 28 to be lower than the ground potential, and the turned-on second N-type FET 26 makes the fourth P-type FET 22 have a gate voltage V1p smaller than the ground potential and have an increased capability of driving the current of the load 32. However, the voltage difference, between V2p (below the ground potential) and Va (at the ground potential), will turn on the third N-type FET 28 and cause current leakage from the ground potential to V2p. The current leakage decreases the level of the below-ground voltage of V1p and V2p. Thus is degraded the performance of the high load driving circuit.

Therefore, the present invention proposes a high load driving device to solve the conventional problems.

SUMMARY OF THE INVENTION

The primary objective of the present invention is to provide a high load driving device, which is formed of a plurality of transistors and exempted from current-leakage paths, and which is applied to a low-voltage circuit system to increase the switching speed of a high load and decrease the delay times, whereby the performance is upgraded without consuming additional power.

To achieve the abovementioned objective, the present invention proposes a high load driving device, which is connected with a load, and which comprises an inverter receiving a digital voltage and outputting the digital voltage inversely. The output terminal of the inverter is connected with a first capacitor, input terminal of the inverter is connected with a first P-type FET, a first N-type FET, a second P-type FET, and a third N-type FET. The load is connected with a high voltage via a P-type push-up FET. The high voltage is connected to the first P-type FET and the second P-type FET. The first N-type FET is connected to the first P-type FET. A second N-type FET is connected to the first P-type FET, the first N-type FET, the first capacitor and a low voltage. The second P-type FET is connected to the P-type push-up FET. The third N-type FET is connected to the first and second N-type FETs, the first capacitor, the second P-type FET and the P-type push-up FET. The first P-type FET, the first N-type FET, the second P-type FET and the third N-type FET all receive digital voltages, and the digital voltages change the conduction states thereof. The conduction state of the first P-type FET determines the conduction state of the second N-type FET. When the digital voltage rises from a low level to a high level, the third N-type FET is turned on to control the gate voltage of the P-type push-up FET to be at a low stabilization voltage that is lower than the low voltage, using the original voltage drop of the first capacitor. Thereby the load is driven to operate fast.

The output terminal of the inverter is connected with a second capacitor, input terminal of the inverter is connected with a fourth N-type FET, a third P-type FET, a fifth N-type FET and a fifth P-type FET. The load is connected to a low voltage via an N-type pull-down FET. The low voltage is connected with the fourth N-type FET and the fifth N-type FET. The third P-type FET is connected with the fourth N-type FET. The fourth P-type FET is connected with the fourth N-type FET, the third P-type FET, the second capacitor, and the high voltage. The fifth N-type FET is connected with the N-type pull-down FET. The fifth P-type FET is connected with the third and fourth P-type FETs, the second capacitor, the fifth N-type FET, and the N-type pull-down FET. The fourth N-type FET, the third P-type FET, the fifth N-type FET and the fifth P-type FET all receive digital voltages, and the digital voltages determine the conduction states thereof. The conduction state of the fourth N-type FET determines the conduction state of the fourth P-type FET. When the digital voltage drops from a high level to a low level, the fifth P-type FET is turned on and controls the gate voltage of the N-type pull-down FET to be at a high stabilization voltage that is higher than the high voltage, using the original voltage drop of the second capacitor. Thereby the load is driven to operate fast.

Below, the embodiments are described in detail in cooperation with the drawings to demonstrate the technical contents and accomplishments of the present invention.

DETAILED DESCRIPTION OF THE INVENTION

Figure 1:
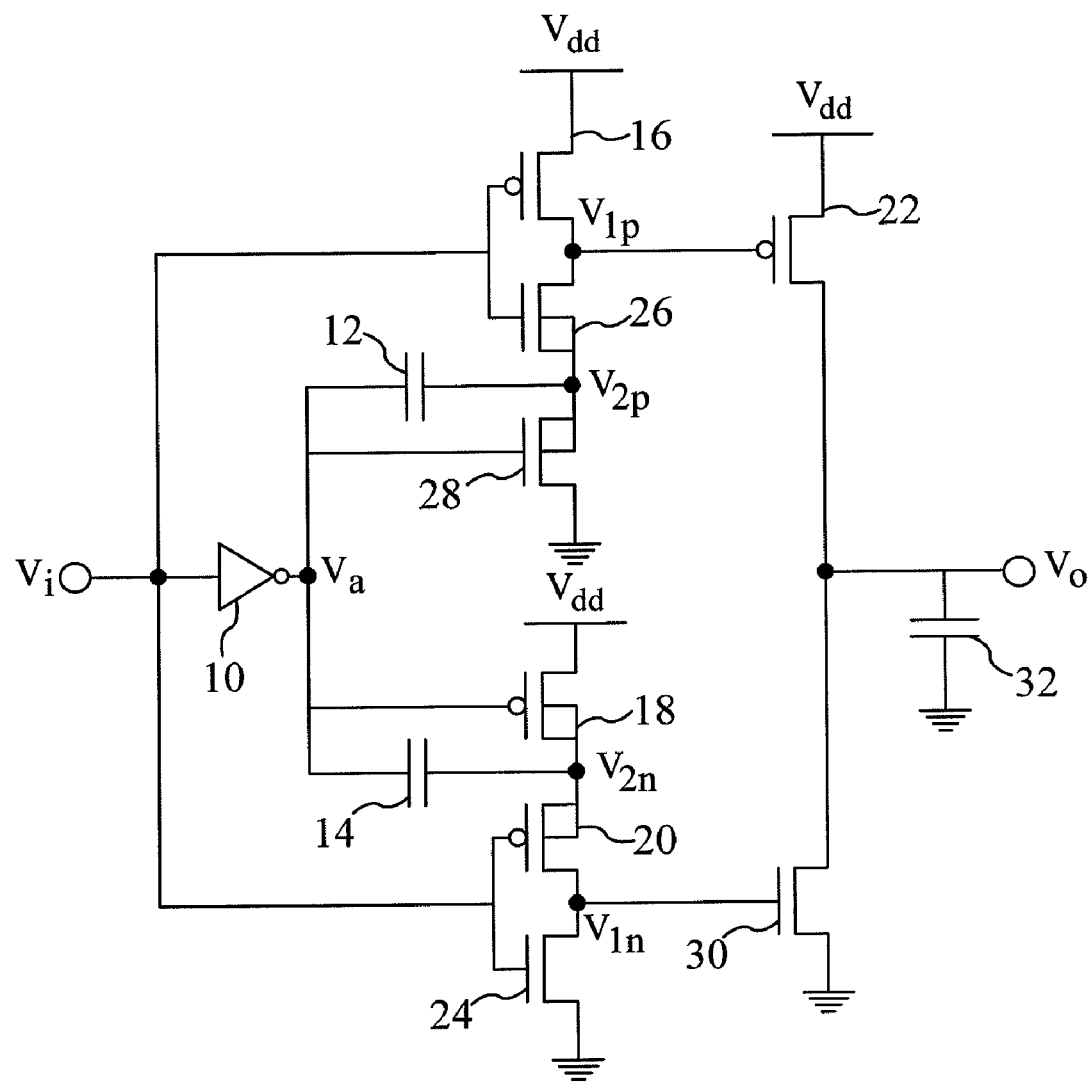
FIG. 1 is a diagram showing a conventional high load driving circuit.
Figure 2:
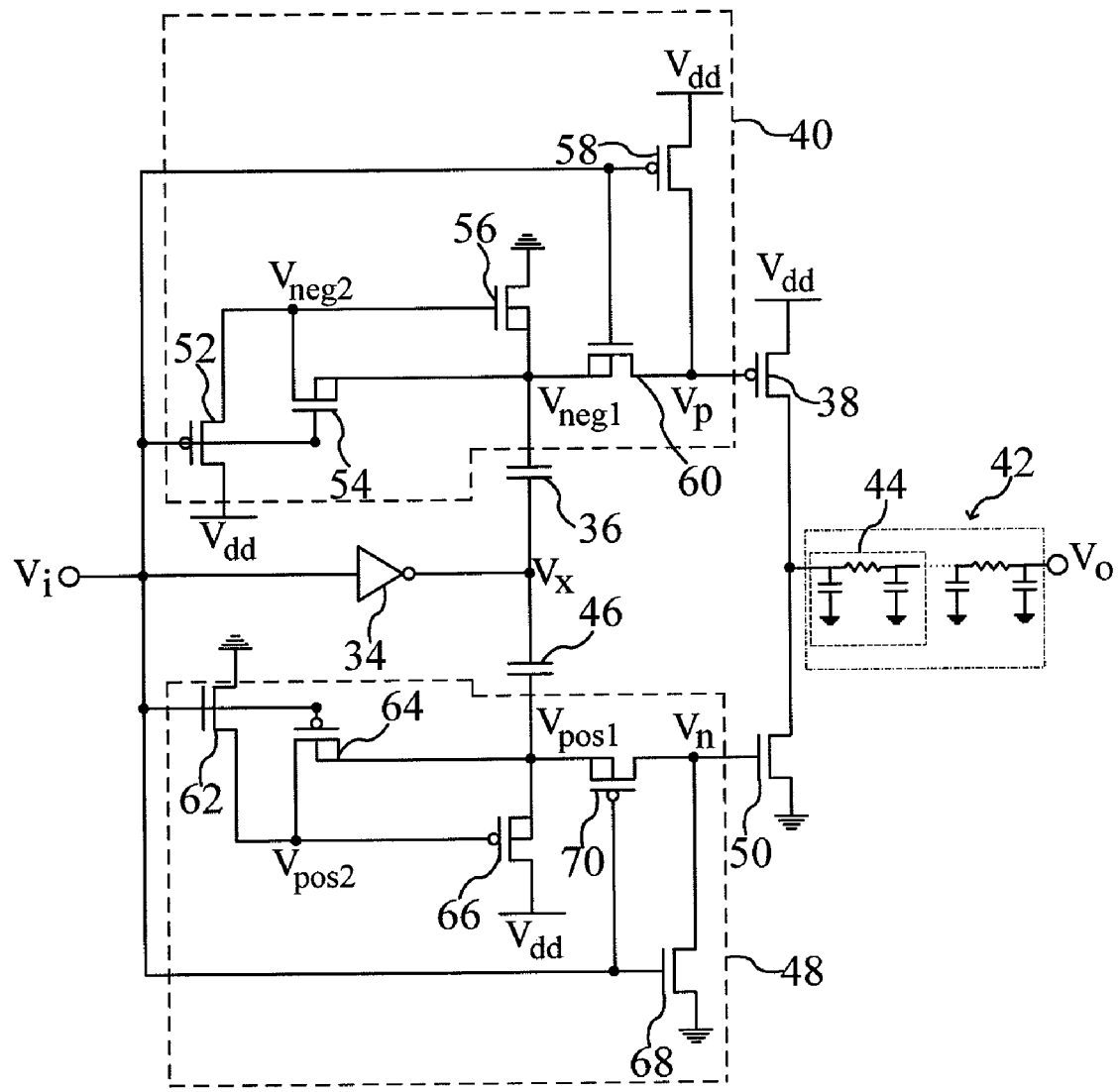
FIG. 2 is a diagram showing the circuit of a high load driving device according to the present invention.

Refer to FIG. 2. The high load driving device of the present invention comprises an inverter 34, a first capacitor 36, a P-type push-up FET 38, a push-up circuit 40, a N-type pull-down FET 50, a second capacitor 46 and a pull-down circuit 48. The first capacitor 36 has a first electrode and a second electrode. The input terminal and output terminal of the inverter 34 are respectively connected with the push-up circuit 40 and the first electrode. The inverter 34 receives a digital voltage, reverses the digital voltage and outputs the reversed digital voltage. The push-up circuit 40 is also connected with the gate of the P-type push-up FET 38 and a low voltage. In one embodiment, the low voltage is exemplified by the ground potential. The source and drain of the P-type push-up FET 38 are respectively connected with a high voltage Vdd and a load 42. The load 42 is formed via connecting a plurality of load units 44. Each load unit 44 includes a resistor and two capacitors to be a load model. When the digital voltage rises from a low level to a high level, the push-up circuit 40 utilizes the original first voltage drop of the first capacitor 36 to control the gate voltage of the P-type push-up FET 38 to be at a low stabilization voltage that is lower than the low voltage. Thereby the load 42 is driven to operate fast.

The second capacitor 46 has a third electrode and a fourth electrode respectively connected with the output terminal of the inverter 34 and the pull-down circuit 48. The pull-down circuit 48 is also connected with the gate of the N-type pull-down FET 50 and the high voltage Vdd. The source and drain of the N-type pull-down FET 50 are respectively connected with the low voltage and the load 42. When the digital voltage drops from a high level to a low level, the pull-down circuit 48 utilizes the original second voltage drop of the second capacitor 46 to control the gate voltage of the N-type pull-down FET 50 to be at a high stabilization voltage that is higher than the high voltage. Thereby the load 42 is driven to operate fast.

The push-up circuit 40 includes a first P-type FET 52. The gate, source and drain of the first P-type FET 52 are respectively connected with the input terminal of the inverter 34, the high voltage Vdd and a first N-type FET 54. The gate of the first P-type FET 52 receives the digital voltage, and the digital voltage determines the conduction state of the first P-type FET 52. The gate, drain and source of the first N-type FET 54 are respectively connected with the input terminal of the inverter 34, the drain of the first P-type FET 52 and a second N-type FET 56. The gate of the first N-type FET 54 receives a digital voltage, and the digital voltage determines the conduction state of the first N-type FET 54. The gate of the second N-type FET 56 is connected with the drains of the first P-type FET 52 and first N-type FET 54. The drain of the second N-type FET 56 is connected with the low voltage. The source of the second N-type FET 56 is connected with the source of the first N-type FET 54 and the second electrode. The conduction state of the first P-type FET 52 determines the conduction state of the second N-type FET 56. The push-up circuit 40 also includes a second P-type FET 58. The gate of the second P-type FET 58 is connected with the input terminal of the inverter 34. The source of the second P-type FET 58 is connected with the high voltage Vdd. The drain of the second P-type FET 58 is connected with gate of the P-type push-up FET 38 and a third N-type FET 60. The gate of the second P-type FET 58 receives a digital voltage, and the digital voltage determines the conduction state of the second P-type FET 58.

The gate of the third N-type FET 60 is connected with the input terminal of the inverter 34 and the gate of the second P-type FET 58. The source of the third N-type FET 60 is connected with the source of the first N-type FET 54, the source of the second N-type FET 56 and the second electrode. The drain of the third N-type FET 60 is connected with the gate of the P-type push-up FET 38 and the drain of the second P-type FET 58. The gate of the third N-type FET 60 receives a digital voltage, and the digital voltage determines the conduction state of the third N-type FET 60. When the digital voltage rises from a low level to a high level, the third N-type FET 60 utilizes the original first voltage drop of the first capacitor 36 to control the gate voltage of the P-type push-up FET 38 to be at a low stabilization voltage that is lower than the low voltage. Thereby the load 42 is driven to operate fast.

The pull-down circuit 48 includes a fourth N-type FET 62. The gate, source and drain of the fourth N-type FET 62 are respectively connected with the input terminal of the inverter 34, the low voltage and a third P-type FET 64. The gate of the fourth N-type FET 62 receives a digital voltage, and the digital voltage determines the conduction state of the fourth N-type FET 62. The gate, drain and source of the third P-type FET 64 are respectively connected with the input terminal of the inverter 34, the drain of the fourth N-type FET 62 and a fourth P-type FET 66. The gate of the third P-type FET 64 receives a digital voltage, and the digital voltage determines the conduction state of the third P-type FET 64. The gate of the fourth P-type FET 66 is connected with the drains of the fourth N-type FET 62 and third P-type FET 64. The drain of the fourth P-type FET 66 is connected with the high voltage Vdd. The source of the fourth P-type FET 66 is connected with the source of the third P-type FET 64 and the fourth electrode. The conduction state of the fourth N-type FET 62 determines the conduction state of the fourth P-type FET 66. The pull-down circuit 48 also includes a fifth N-type FET 68.

The gate of the fifth N-type FET 68 is connected with the input terminal of the inverter 34. The source of the fifth N-type FET 68 is connected with the low voltage. The drain of the fifth N-type FET 68 is connected with the gate of the N-type pull-down FET 50 and a fifth P-type FET 70. The gate of the fifth N-type FET 68 receives a digital voltage, and the digital voltage determines the conduction state of the fifth N-type FET 68.

The gate of the fifth P-type FET 70 is connected with the input terminal of the inverter 34 and the gate of the fifth N-type FET 68. The source of the fifth P-type FET 70 is connected with the source of the third P-type FET 64, the source of the fourth P-type FET 66 and the fourth electrode. The drain of the fifth P-type FET 70 is connected with the gate of the N-type pull-down FET 50 and the drain of the fifth N-type FET 68. The gate of the fifth P-type FET 70 receives a digital voltage, and the digital voltage determines the conduction state of the fifth P-type FET 70. When the digital voltage drops from a high level to a low level, the fifth P-type FET 70 utilizes the original voltage drop of the second capacitor 46 to control the gate voltage of the N-type pull-down FET 50 to be at a high stabilization voltage that is higher than the high voltage Vdd. Thereby the load 42 is driven to operate fast.

Figure 3:
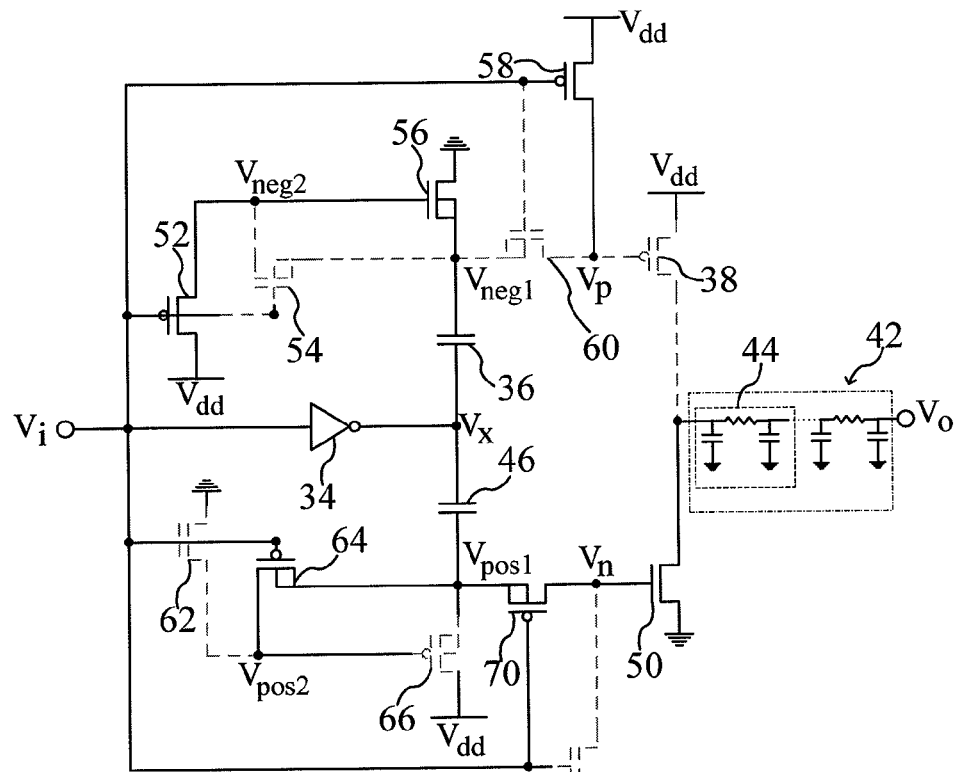
FIG. 3 is a diagram showing the operation of a high load driving device receiving a digital low-level voltage input according to the present invention.

Below is described the operation of the upper portion of the circuit. Refer to FIG. 3, wherein the dotted lines denote the turned-off transistors and the solid lines denote the turned-on transistors. When the digital voltage Vi is at a low level, the terminal voltage Vx output by the inverter 34 is at a high level. As the digital Vi is at a low level, the first P-type FET 52 and the second P-type FET 58 are turned on, and the first N-type FET 54 and the third N-type FET 60 are turned off. As the first P-type FET 52 is turned on, the drain voltage Vneg2 of the first P-type FET 52 is about at the high voltage Vdd, which turns on the second N-type FET 56. As the second N-type FET 56 is turned on, the source voltage Vneg1 of the second N-type FET 56 is about at the low voltage (the ground potential). At this time, the first voltage drop across the first capacitor 36 is the difference between the high-level digital voltage and the ground potential. As the second P-type FET 58 is turned on, the drain voltage Vp of the second P-type FET 58 is about at the high voltage Vdd, which turns off the P-type push-up FET 38.

Figure 4:
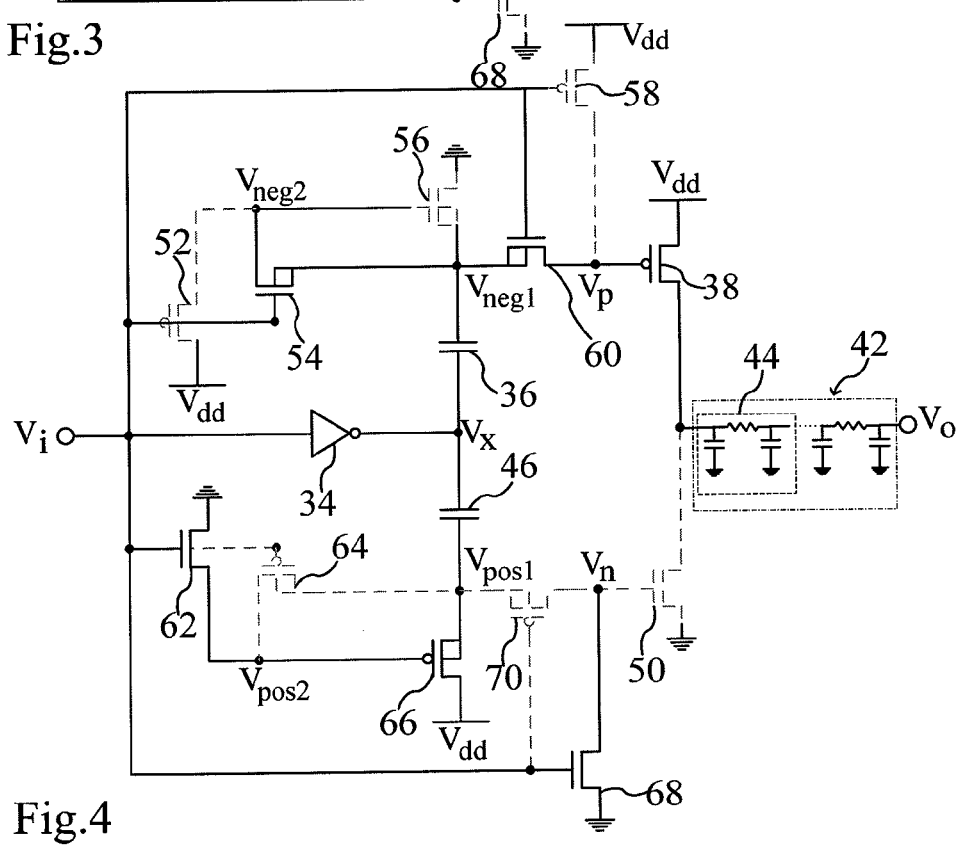
FIG. 4 is a diagram showing the operation of a high load driving device receiving a digital high-level voltage input according to the present invention.

Refer to FIG. 4, wherein the dotted lines denote the turned-off transistors and the solid lines denote the turned-on transistors. When the digital voltage Vi rises from a low level to a high level, the terminal voltage Vx output by the inverter 34 drops instantaneously from a high-level digital voltage to a low-level digital voltage. At this time, the first capacitor 36 has accumulated charges and has the first voltage drop with Vneg1 at the ground potential. In order to maintain the first voltage drop, the voltage Vneg1 of the second electrode of the first capacitor 36 is controlled to be at a low stabilization voltage that is lower than the ground potential in response to the dropping of the first electrode voltage Vx. The difference between the low stabilization voltage and the ground potential is equal to the difference between the high level and low level of the digital voltage. As the digital voltage Vi is at a high level, the first and second P-type FETs 52 and 58 are turned off, and the first and third N-type FETs 54 and 60 are turned on. As the first and third N-type FETs 54 and 60 are turned on, the drain voltage Vneg2 and source voltage Vneg1 of the first N-type FET 54 are equal to the drain voltage Vp of the third N-type FET 60. Thus, no current leakage occurs in the paths connecting the abovementioned three points, and the voltages Vneg2, Vneg1 and Vp would not change. As the voltage difference between Vneg2 and Vneg1 is zero, the second N-type FET 56 is turned off. From the above description, it is known that Vp is at the low stabilization voltage and that the P-type push-up FET 38 is turned on. Thereby the load 42 is driven to operate fast.

Below is described the operation of the lower portion of the circuit. Refer to FIG. 4 again, wherein the dotted lines denote the turned-off transistors and the solid lines denote the turned-on transistors. When the digital voltage Vi is at a high level, the output terminal voltage Vx of the inverter 34 is a low-level digital voltage. As the digital voltage Vi is at a high level, the fourth and fifth N-type FETs 62 and 68 are turned on, and the third and fifth P-type FETs 64 and 70 are turned off. As the fourth N-type FET 62 is turned on, the drain voltage Vpos2 of the fourth N-type FET 62 is about at the ground potential, which turns on the fourth P-type FET 66. As the fourth P-type FET 66 is turned on, the source voltage Vpos1 of the fourth P-type FET 66 is about at the high voltage Vdd. At this time, the second voltage drop across the two electrodes of the second capacitor 46 is equal to the difference between the low-level digital voltage and the high voltage Vdd. As the fifth N-type FET 68 is turned on, the drain voltage Vn of the fifth N-type FET 68 is about at the ground potential, which turns off the N-type pull-down FET 50.

Refer to FIG. 3 again, wherein the dotted lines denote the turned-off transistors and the solid lines denote the turned-on transistors. When the digital Vi drops from a high level to a low level, the output terminal voltage Vx of the inverter 34 rises instantaneously from a low-level digital voltage to a high-level voltage. At this time, the second capacitor 46 has accumulated charges and has a second voltage drop, and Vpos1 is at the high voltage Vdd. In order to maintain the second voltage drop, the voltage Vpos1 of the fourth electrode of the second capacitor 46 is controlled to be at a high stabilization voltage that is higher than the high voltage Vdd in response to the dropping of the third electrode voltage Vx. The difference between the high stabilization voltage and the high voltage Vdd is equal to the difference between the high level and low level of the digital voltage. As the digital voltage Vi is at a low level, the fourth and fifth N-type FETs 62 and 68 are turned off, and the third and fifth P-type FETs 64 and 70 are turned on. As the third and fifth P-type FETs 64 and 70 are turned on, the drain voltage Vpos2 and source voltage Vpos1 of the third P-type FET 64 is equal to the drain voltage Vn of the fifth P-type FET 70. Thus, no current leakage occurs in the paths connecting the abovementioned three points, and the voltages Vpos2, Vpos1 and Vn would not change. As the voltage difference between Vpos2 and Vpos1 is zero, the fourth P-type FET 66 is turned off. From the above description, it is known that Vn is at the high stabilization voltage and that the N-type pull-down FET 50 is turned on. Thereby the load 42 is driven to operate fast.

Figure 5:
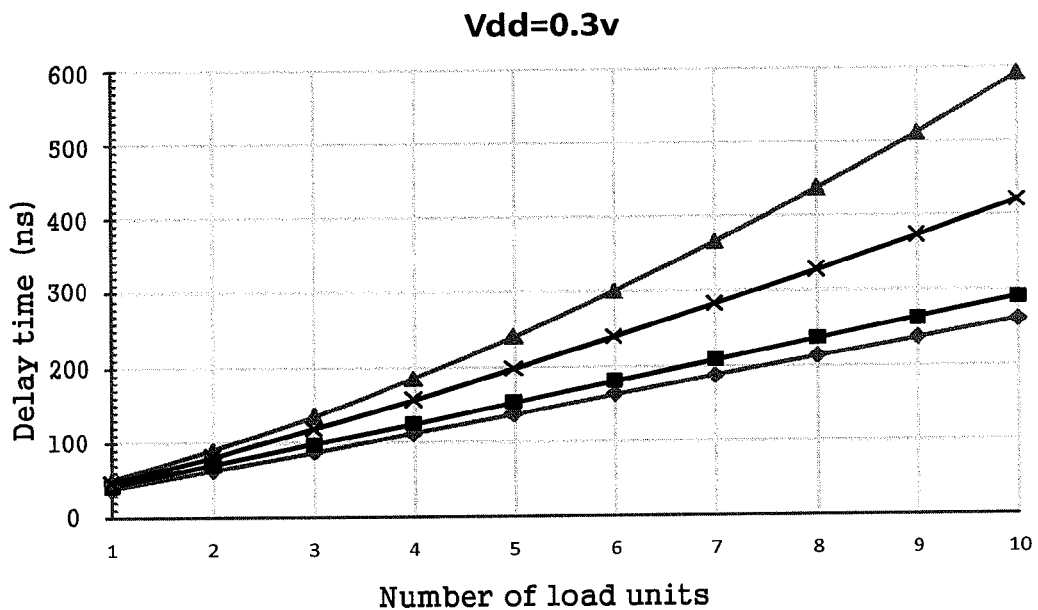
FIG. 5 is a diagram showing the comparison of the delay times of the prior art and the present invention.
Figure 6:
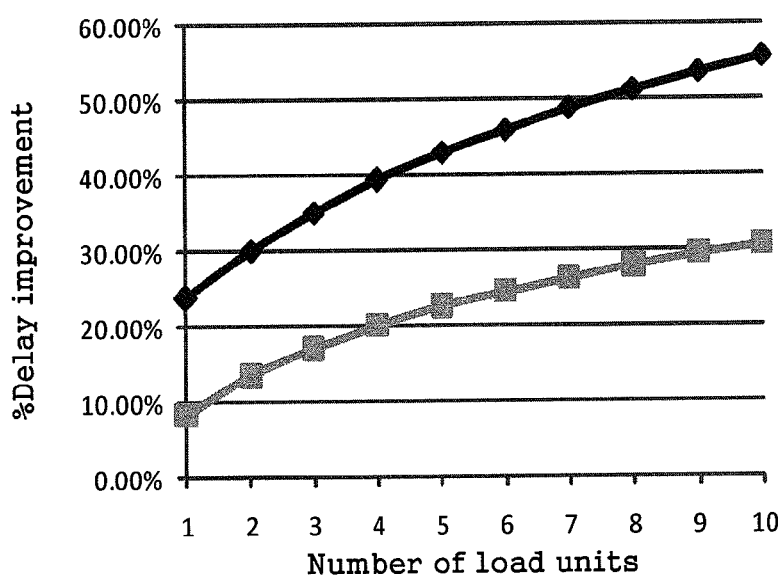
FIG. 6 is a diagram showing the percentages by which the delay times are improved by the prior and the present invention.

Refer to FIG. 2 and FIG. 5. In FIG. 5, the triangles and crosses respectively denote the data obtained in the push-up activities and pull-down activities undertaken by the prior arts; the diamonds and squares respectively denote the data obtained in the push-up activities and pull-down activities undertaken by the present invention; the high voltage Vdd used in the abovementioned activities is 0.3V. From FIG. 5, it is known that the P-type push-up FET 38 and the N-type pull-down FET 50 can attain shorter delay times than the prior arts no matter how many load units 44 there are. In the present invention, the more the load units 44, the greater the scale by which the delay time is shortened. Refer to FIG. 6 for the effects of the push-up and pull-down activities by the present invention, wherein the diamonds and squares respectively the effects of the push-up and pull-down activities. In the present invention, the push-up activities can shorten the delay times by 24-56%, and the pull-down activities can shorten the delay times by 9-30%.

Figure 7:
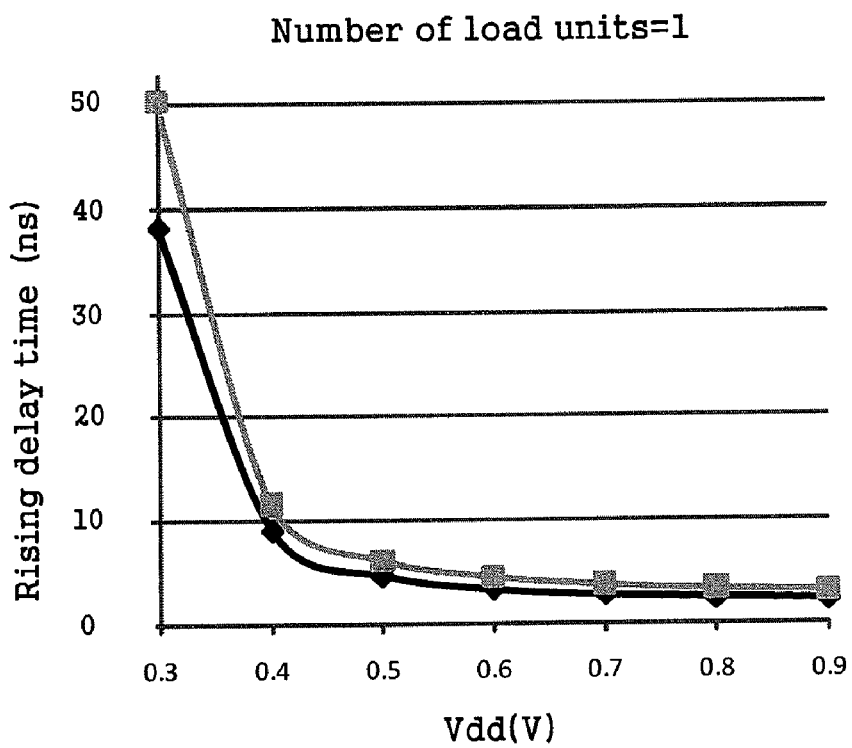
FIG. 7 is a diagram showing the relationships between the delay times and the values of Vdd in the push-up activities of the prior art and the present invention.
Figure 8:
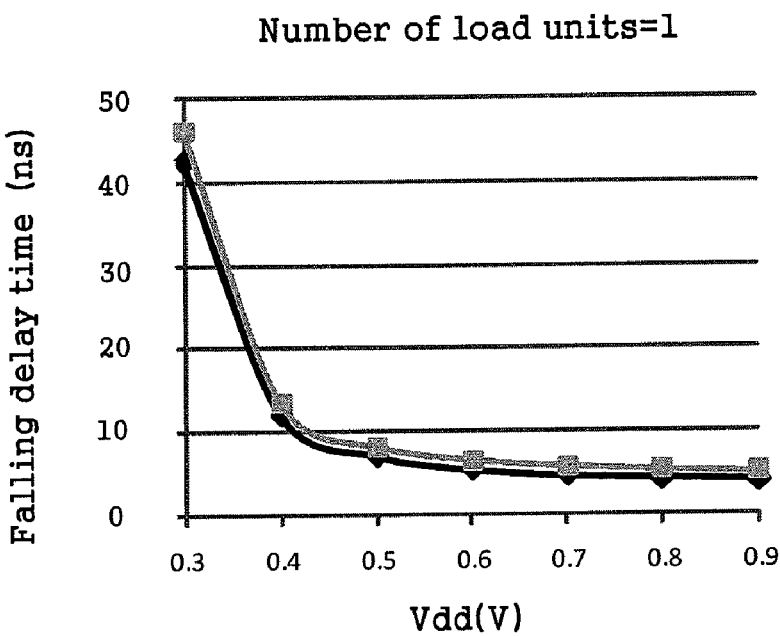
FIG. 8 is a diagram showing the relationships between the delay times and the values of Vdd in the pull-down activities of the prior art and the present invention.

Refer to FIG. 2, FIG. 7 and FIG. 8. In FIG. 7 and FIG. 8, the squares and diamonds respectively denote the data of the prior art and the present invention, and a single load unit 44 is used in the experiments. From FIG. 7 and FIG. 8, it is known: no matter what voltage is used as the high voltage Vdd, the P-type push-up FET 38 and the N-type pull-down FET 50 can attain shorter delay times than the prior arts. In the present invention, the higher the high voltage Vdd, the shorter the delay time. Therefore, the present invention can effectively increase the switching speed, shorten the delay time and promote the performance in a low-voltage high-load circuit.

Figure 9:
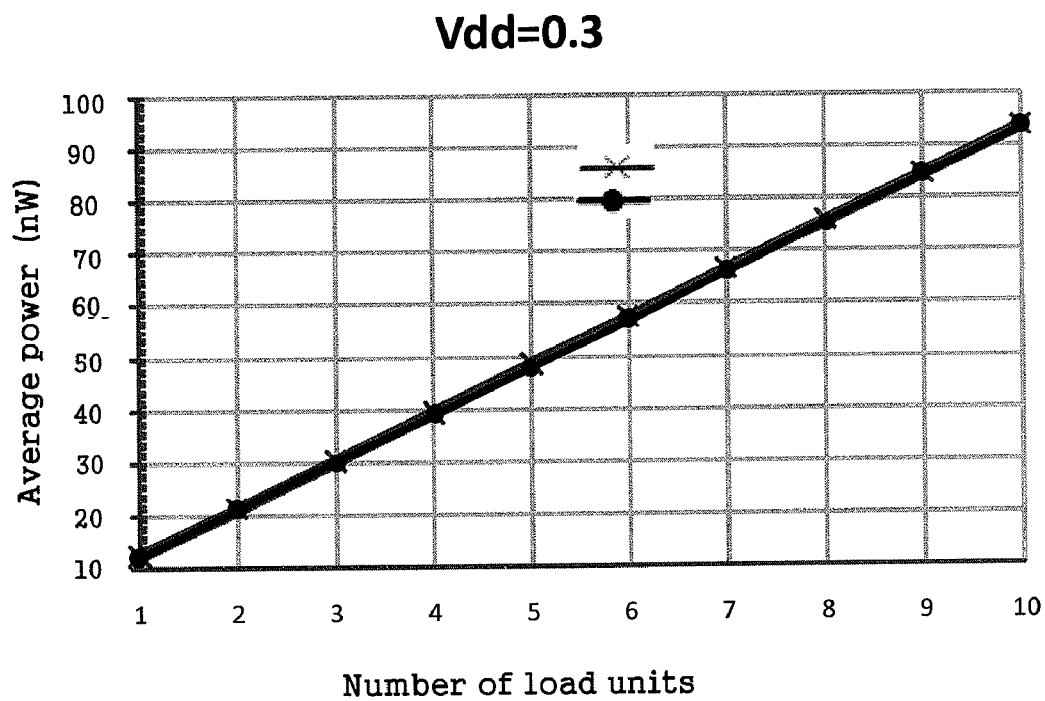
FIG. 9 is a diagram showing the relationships between the average power and the number of load units at the same working clock in the prior art and the present invention.
Figure 10:
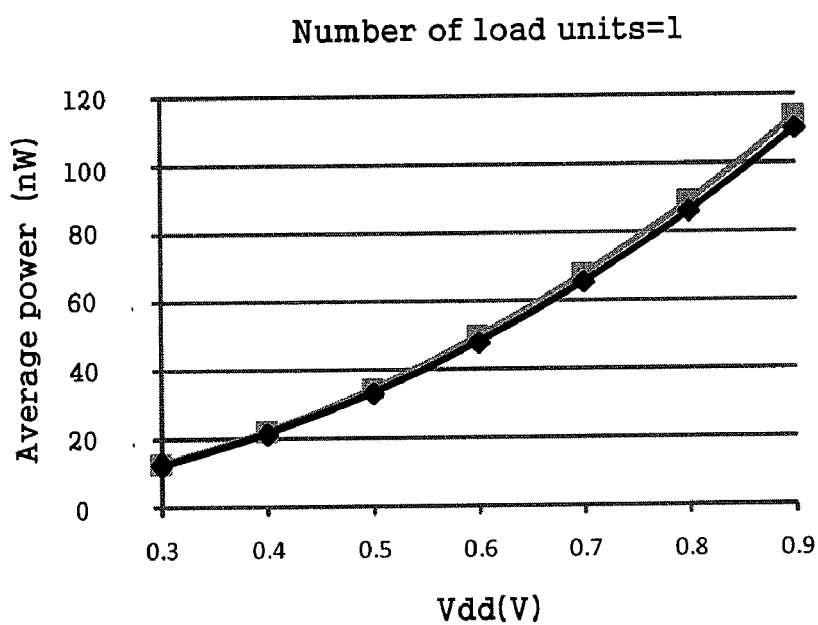
FIG. 10 is a diagram showing the relationships between the average power and the value of Vdd at the same working clock in the prior art and the present invention.

Refer to FIG. 9, wherein the crosses and circles respectively denote the data of the prior art and the present invention. From FIG. 9, it is known: no matter how many load units are involved, the present invention does not consume more energy than the prior art at a given DC voltage and at the same working clock. Refer to FIG. 10, wherein the squares and diamonds respectively denote the data of the prior art and the present invention. From FIG. 10, it is known: no matter what voltage is used as the high voltage Vdd, the present invention does not consume more energy than the prior art at the same working clock and with the same number of load units.

In conclusion, the present invention proposes a high load driving device, which is applied to a low-voltage high-load circuit system, and which can increase the switching speed and decrease the delay time without increasing power consumption.

The embodiments described above are only to exemplify the present invention but not to limit the scope of the present invention. Any equivalent modification or variation according to the technical contents or spirit of the present invention is to be also included within the scope of the present invention.

What is claimed is:

1. A high load driving device, which is connected with a load, comprising
    an inverter receiving a digital voltage, reversing said digital voltage into a reversed digital voltage, and outputting said reversed digital voltage;
    a first capacitor having a first electrode and a second electrode, where said first electrode is connected with an output terminal of said inverter;
    a P-type push-up field-effect transistor (FET) connected with a high voltage and said load;
    a first P-type FET connected with an input terminal of said inverter and said high voltage, receiving said digital voltage, and switching a conduction state thereof according to said digital voltage;
    a first N-type FET connected with said first P-type FET and said input terminal of said inverter, receiving said digital voltage, and switching a conduction state thereof according to said digital voltage;
    a second N-type FET connected with said first P-type FET, said first N-type FET, said second electrode and a low voltage, and switching a conduction state thereof according to a conduction state of said first P-type FET;
    a second P-type FET connected with said high voltage, said input terminal of said inverter and said P-type push-up FET, receiving said digital voltage, and switching a conduction state thereof according to said digital voltage; and
    a third N-type FET connected with said first N-type FET, said second N-type FET, said second electrode, said second P-type FET, said P-type push-up FET and said input terminal of said inverter, receiving said digital voltage, switching a conduction state thereof according to said digital voltage, and using an original first voltage drop of said first capacitor to control a gate voltage of said P-type push-up FET to be at a low stabilization voltage that is lower than said low voltage to drive said load to operate fast when said digital voltage rises from a low level to a high level.

2. The high load driving device according to claim 1, wherein when said digital voltage is at said low level, said first P-type FET, said second N-type FET and said second P-type FET are turned on, and said first N-type FET, said P-type push-up FET and said third N-type FET are turned off, and wherein said first voltage drop is equal to difference between a voltage of said high level and said low level voltage.

3. The high load driving device according to claim 1, wherein when said digital voltage rises from said low level to said high level, said first P-type FET, said second N-type FET and said second P-type FET are turned off, and said first N-type FET, said P-type push-up FET and said third N-type FET are turned on, and wherein said second electrode is controlled to be at said low stabilization voltage in response to voltage variation of said first electrode, and wherein said third N-type FET controls a gate voltage of said P-type push-up FET to be at said low stabilization voltage, whereby said load is driven to operate fast.

4. The high load driving device according to claim 1, wherein a source and a drain of said P-type push-up FET are respectively connected with said high voltage and said load, and wherein a gate and a source of said first P-type FET are respectively connected with said input terminal of said inverter and said high voltage, and said gate of said first P-type FET receives said digital voltage, and wherein a gate and a drain of said first N-type FET are respectively connected with said input terminal of said inverter and a drain of said first P-type FET, and said gate of said first N-type FET receives said digital voltage, and wherein a gate of said second N-type FET is connected with drains of said first P-type FET and said first N-type FET, and a drain of said second N-type FET is connected with said low voltage, and a source of said second N-type FET is connected with a source of said first N-type FET and said second electrode, and wherein a gate of said second P-type FET is connected with said input terminal of said inverter, and a source of said second P-type FET is connected with said high voltage, and a drain of said second P-type FET is connected with a gate of said P-type push-up FET, and said gate of said second P-type FET receives said digital voltage, and wherein a gate of said third N-type FET is connected with said input terminal of said inverter and said gate of said second P-type FET, and a source of said third N-type FET is connected with said source of said first N-type FET, said source of said second N-type FET and said second electrode, and a drain of said third N-type FET is connected with said gate of said P-type push-up FET and said drain of said second P-type FET, and said gate of said third N-type FET receives digital voltage.

5. The high load driving device according to claim 1 further comprising
    a second capacitor having a third electrode and a fourth electrode, wherein said third electrode connected with said output terminal of said inverter;
    an N-type pull-down FET connected with said low voltage and said load;
    a fourth N-type FET connected with said input terminal of said inverter and said low voltage, receiving said digital voltage, and switching a conduction state thereof according to said digital voltage;

a third P-type FET connected with said fourth N-type FET and said input terminal of said inverter, receiving said digital voltage, and switching a conduction state thereof according to said digital voltage;

a fourth P-type FET connected with said fourth N-type FET, said third P-type FET, said fourth electrode and said high voltage, and switching a conduction state thereof according a conduction state of said fourth N-type FET;

a fifth N-type FET connected with said low voltage, said input terminal of said inverter and said N-type pull-down FET, receiving said digital voltage, and switching a conduction state thereof according to said digital voltage; and a fifth P-type FET connected with said third P-type FET, said fourth P-type FET, said fourth electrode, said fifth N-type FET, said N-type pull-down FET and said input terminal of said inverter, receiving said digital voltage, switching a conduction state thereof according to said digital voltage, and using an original second voltage drop of said second capacitor to control a gate voltage of said N-type pull-down FET to be at a high stabilization voltage that is higher than said high voltage to drive said load to operate fast when said digital voltage drops from said high level to said low level.

6. The high load driving device according to claim 5, wherein when said digital voltage is at said high level, said fourth N-type FET, said fourth P-type FET and said fifth N-type FET are turned on, and said third P-type FET, said N-type pull-down FET and said fifth P-type FET are turned off, and wherein said second voltage drop is equal to difference between a voltage of said low level and said high voltage.

7. The high load driving device according to claim 5, wherein when said digital voltage drops from said high level to said low level, said fourth N-type FET, said fourth P-type FET and said fifth N-type FET are turned off, and said third P-type FET, said N-type pull-down FET and said fifth P-type FET are turned on, and wherein said fourth electrode is controlled to be at said high stabilization voltage in response to voltage variation of said third electrode, and wherein said fifth P-type FET controls a gate voltage of said N-type pull-down FET to be at said high stabilization voltage, whereby said load is driven to operate fast.

8. The high load driving device according to claim 5, wherein a source and a drain of said N-type pull-down FET are respectively connected with said low voltage and said load, and wherein a gate and a source of said fourth N-type FET are respectively connected with said input terminal of said inverter and said low voltage, and said gate of said fourth N-type FET receives said digital voltage, and wherein a gate and a drain of said third P-type FET are respectively connected with said input terminal of said inverter and a drain of said fourth N-type FET, and said gate of said third P-type FET receives said digital voltage, and wherein a gate of said fourth P-type FET is connected with said drains of said fourth N-type FET and said third P-type FET, and a drain of said fourth P-type FET is connected with said high voltage, and a source of said fourth P-type FET is connected with a source of said third P-type FET and said fourth electrode, and wherein a gate of said fifth N-type FET is connected with said input terminal of said inverter, and a source of said fifth N-type FET is connected with said low voltage, and a drain of said fifth N-type FET is connected with a gate of said N-type pull-down FET, and said gate of said fifth N-type FET receives said digital voltage, and wherein a gate of said fifth P-type FET is connected with said input terminal of said inverter and said gate of said fifth N-type FET, and a source of said fifth P-type FET is connected with said source of said third P-type FET, said source of said fourth P-type FET and said fourth electrode, and a drain of said fifth P-type FET is connected with said gate of said N-type pull-down FET and said drain of said fifth N-type FET, and said gate of said fifth P-type FET receives said digital voltage.

9. The high load driving device according to claim 1, wherein said low voltage is a ground potential.

\* \* \* \* \*